DIODE-TRANSISTOR SWITCHING CIRCUITS

Filed Feb. 27, 1957

INVENTORS W. B. CAGLE
W. H. CHEN
BY Alan C. Rose
ATTORNEY

United States Patent Office 2,964,653
Patented Dec. 13, 1960

2,964,653

DIODE-TRANSISTOR SWITCHING CIRCUITS

William B. Cagle, Madison, and Wayne H. Chen, Chatham, N.J., assignors to Bell Telephone Laboratories, Incorporated, New York, N.Y., a corporation of New York Filed Feb. 27, 1957, Ser. No. 642,818

5 Claims. (Cl. 307—88.5)

Figures 1, 2:
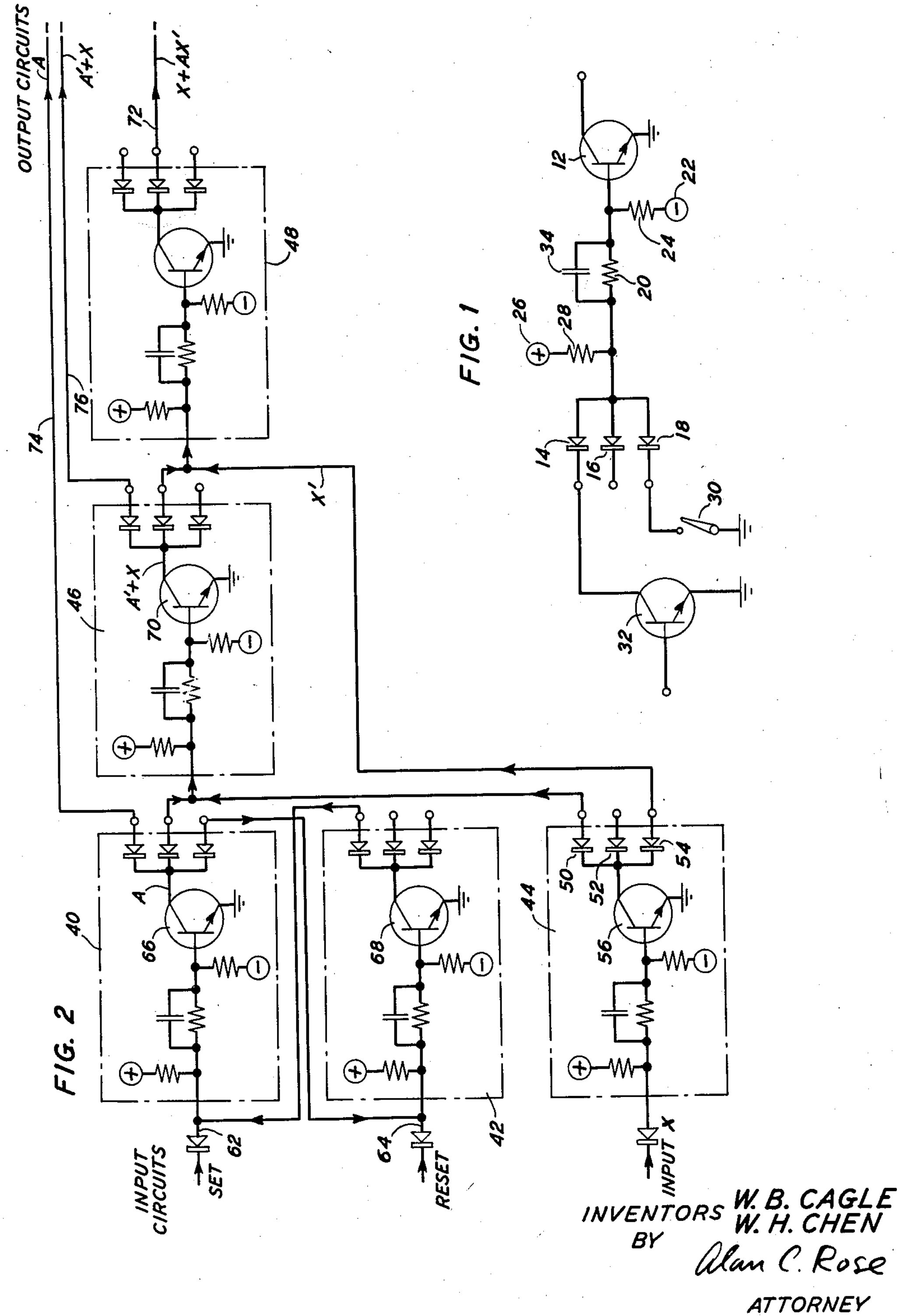

This invention relates to data processing circuits, and more specifically to digital information handling circuits in which transistors and diodes are employed.

Up to the present time, the more promising data processing circuits employing solid state elements have assumed one of two forms. In one type of circuit, diodes have been employed solely for switching or logic functions and transistors have been employed as amplifiers. These circuits characteristically require relatively large signal voltage swings and many levels of power supply voltage. In addition, points of high impedance are often present immediately preceding the transistor amplifiers, and the amplifiers are therefore susceptible to crosstalk and noise pick-up. Although these circuits have been very effective in certain applications, the factors mentioned above have often resulted in circuits which are not entirely satisfactory in operation and which are unnecessarily complex and costly.

Another promising type of data processing circuit is "Direct Coupled Transistor Logic" circuitry, or D.C.T.L., as it is widely called. D.C.T.L. was first described in an article by R. H. Beter et al. which appeared at pages 139 through 145 of part 4 of the 1955 Institute of Radio Engineers Convention Record. D.C.T.L. circuits have the advantage of great simplicity, but are subject to the disadvantages of crosstalk problems, and the reliance for operability on critical transistor properties. Particularly in situations where temperatures stability is important, transistors with properties suitable for D.C.T.L. circuitry are not generally available.

One object of the present invention is to increase the reliability of direct coupled, solid state data processing circuits.

Another object is to simplify data processing circuits in which diodes and transistors are employed.

In accordance with the present invention, diodes are conductively coupled in the circuit between the collectors of a group of driving transistors and the input base electrode of a controlled transistor. In addition, the diodes have like electrodes connected together and to a resistive circuit component which is connected to the base of the transistor. The biases applied to the two sides of the resistive component are such that the grounding of one or more of the diodes switches the controlled transistor from the energized to the de-energized state. When transsistors with low collector-to-emitter resistance are employed, the energization of any one of the driving transistors effectively grounds the diode coupled to the collector of the driving transistor. Accordingly, when any of the driving transistors is energized, the controlled transistor is de-energized; conversely, the controlled transistor is energized only when all of the driving transistors are de-energized.

It is a feature of the invention that diodes are connected in conductive circuits between the collectors of a plurality of transistors and the base of another transistor.

In accordance with a further feature of the invention, the diodes between the driving transistors and the controlled transistor have their like electrodes connected together and to a resistive element which is connected to the base of the controlled transistor, and the diodes have their low resistance direction poled in opposition to the low resistance direction of the base-to-emitter circuit of the controlled transistor.

It is an additional feature of the invention that a voltage source is coupled to the point between the diodes and the resistive element of the circuit described above for biasing the controlled transistor toward the energized state, and that means including said resistive element are provided for de-energizing the controlled transistor when any one of the driving transistors is energized. If the resistive element is an ordinary resistor, an additional source of voltage which is oppositely poled with respect to the other biasing voltage source is coupled to the base of the controlled transistor; however, if the resistive element is a Zener diode, no additional circuitry is required to perform the de-energization function.

The present circuits offer a number of advantages as compared with the prior art transistor-diode circuits. Specifically, the alternation of diode gates and a transistor amplification stage produces a logic system in which the gain is distributed and impedances are relatively low, with the result that there is less tendency toward crosstalk or noise pick-up. Other advantages include the low voltage swings which are employed, and the reduction in the number of supply voltages which are required, as compared with many of the transistor-diode circuits of the prior art. In addition, the use of conductive paths interconnecting successive stages through a single diode gate means that a conductive path may be established between the collector of a driving transistor and the base of the controlled transistor in the next subsequent stage. The driving transistor can therefore "reach through" the diode logic circuitry and draw reverse base current directly from the controlled transistor to speed up its de-energization.

Other objects, features, and advantages of the invention may be readily apprehended from a consideration of the following detailed description and the drawing, in which:

Fig. 1 shows an elemental transistor-diode logic circuit in accordance with the invention; and Fig. 2 represents a simple logic circuit in accordance with the invention which is built up from the circuit of Fig. 1.

Referring more particularly to the drawings, Fig. 1 shows, by way of example, a basic logic circuit including the transistor 12 and the three diodes 14, 16, and 18. The transistor has its emitter grounded and the input control circuit connected to the base of the transistor includes the resistive element 20 and the three diodes 14, 16, and 18. The transistor 12 is a junction transistor, and is shown in the drawing as an N-P-N transistor. It may, of course, be a P-N-P transistor if the polarity of the associated circuitry is also reversed. When the input to the base of transistor 12 is positive so that the base-to-emitter circuit is biased in the forward direction, the transistor 12 is energized. When a junction transistor is energized, the collector-to-emitter resistance is very low, and the collector drops nearly to ground potential. When the base is biased in the high resistance direction with respect to the emitter, however, the collector-to-emitter resistance is very high, and the collector is essentially open-circuited.

Referring to the N-P-N transistor 12 in Fig. 1, a negative voltage at the base tends to turn the transistor off, and a positive input voltage tends to energize the transistor. The negative voltage supplied at terminal 22 is coupled to the base of transistor 12 by the resistor 24, and biases the transistor toward the de-energized state. The positive voltage source at terminal 26 is coupled to the base of transistor 12 by resistor 28 and 20, and biases the transistor toward the energized state.

When the input circuits to the three diodes 14, 16, and 18 are open, the positive bias overbalances the negative bias, and the transistor 12 is energized. When the input to any one of the diodes 14, 16, or 18 is grounded, however, the positive bias provided by the positive voltage source connected to terminal 26 is shorted to ground. This could, for example, be accomplished by the closure of switch 30 connected to diode 18, or by the energization of transistor 32 connected to diode 14. When the positive bias is shorted to ground, the base of the transistor 12 becomes slightly negative, and the transistor 12 is turned off. The condenser 34 is useful in speeding up the switching of the transistor 12, particularly when it is being de-energized. More specifically, when one of the diode inputs is grounded, the condenser 34 produces an initial current surge in the direction which tends to discharge the condenser. This is also the reverse current direction of the base-to-emitter portion of the transistor 12, so the surge speeds up the switching action.

In computer circuit parlance, it has recently become customary to talk of "AND" circuits or "OR" circuits. From some standpoints, the circuit of Fig. 1 may be considered to be either an AND circuit or an OR circuit. For example, when all three inputs to the diodes 14 through 18 of Fig. 1 are open-circuited, the transistor 12 is energized and the collector of transistor 12 is substantially at ground potential. The circuit may therefore be considered to be an AND circuit. However, if any one of the input circuits to the diodes 14 through 18 is grounded, the transistor 12 is de-energized and its collector output electrode is open-circuited or "high." From this standpoint, therefore, the circuit may be considered to be an OR circuit. The concept of AND or OR circuits is not entirely satisfactory for the present circuitry because each stage of logic, including a circuit such as that shown in Fig. 1, introduces an inversion of the input signals from ground to open-circuit, or vice versa. It is therefore more desirable to analyze the operation of each circuit individually.

Although many different combinations of circuit component values may be employed, one set which has been successfully used is as follows:

| | |
|---|---|
| R–20 ohms | 1,000 |
| R–24 do | 24,000 |
| R–28 do | 11,000 |
| C–34 micromicrofarads | 2,000 |
| Voltage at terminal 22 volts | −22 |
| Voltage at terminal 26 do | +22 |

The transistors which were employed were diffused base silicon transistors. Any fast computer diodes may be employed. With circuit components having the values indicated above, a voltage swing of about +1 to +3 volts is produced at the diode side of resistor 20, and there is a voltage swing of about 0 to +1 volts at the base input of transistor 12 for the two operating states of the circuit.

It may be noted that the circuit of Fig. 1 may be simplified by the substitution of a nonlinear resistive element of a particular type for the resistor 20 of Fig. 1. Specifically, a Zener diode having a breakdown voltage of about 2 or 3 volts in the reverse current direction may be substituted for the resistor 20, with the anode of the Zener diode connected to the base of the transistor 12. The polarity of the Zener diode should be reversed for use with P-N-P transistors. The Zener diode should preferably be a silicon junction diode with a relatively large junction capacitance. When this substitution is made, the resistor 24, the negative source of voltage connected to resistor 24, and the capacitor 34 may be eliminated, in addition to resistor 20. When the inputs to the diodes 14, 16, and 18 are open-circuited, the positive voltage applied to terminal 26 causes breakdown of the Zener diode and the transistor 12 is energized. When the input to one of the diodes 14, 16, or 18 is grounded, the Zener diode returns to the high resistance state and no base current flows in transistor 12. The transistor is therefore de-energized. It will be recalled that the capacitor 34 in Fig. 1 helped speed up the de-energization of the transistor 12. The high junction capacitance of the Zener diode performs the same function when such a resistive element is substituted for the resistor 20 as indicated above.

The circuit of Fig. 2 is a logic circuit employing switching networks which are similar to that shown in Fig. 1. The five elemental switching networks which are employed in Fig. 2 are networks 40, 42, 44, 46, and 48. Comparing the circuit in the dash-dot box 44 with that of Fig. 1, it may be noted that the three diodes 50, 52, and 54 are all connected to the collector of the transistor 56, whereas in Fig. 1 the three diodes 14, 16, and 18 are connected to the base input electrode of the transistor 12. From a circuit standpoint, it is clear that the two circuits are substantially equivalent; that is, from a logic circuit standpoint it makes no difference whether the diodes are located at the output of each preceding stage or are grouped together at the input of the next stage. For convenience in explanation, the diodes 14, 16, and 18 in Fig. 1 were grouped at the input of the circuit unit. In a particular case, one type of grouping may be preferred over the other, depending on the distribution of wiring capacities. Accordingly, in Fig. 2 the diodes are shown located near the collectors of the transistors, as an alternative to the arrangement of Fig. 1.

In the circuit of Fig. 2, the two logic circuit components 40 and 42 are intercoupled to form a multivibrator. This may readily be accomplished by connecting the output from one of the diodes of each circuit to the input of the other circuit. The set and reset signals applied to the input leads 62 and 64, respectively, of the multivibrator must have the effect of grounding the input leads to change the state of the multivibrator. Thus, for example, if input lead 62 to circuit 40 is grounded, transistor 66 in circuit 40 is de-energized, and transistor 68 in circuit 42 is energized.

The nature of the circuit of Fig. 2 will now be examined in some detail. Initially, the convention which will be employed for expressing the relationship of the signals at various points in the circuit will be based on the principles of Boolean algebra. These principles are well known in the computer and switching arts; for example, Boolean algebra is discussed in a text entitled "The Design of Switching Circuits" by W. Keister, A. E. Ritchie, and S. H. Washburn, D. Van Nostrand Company, Inc., New York, 1951. In using Boolean algebra, capital letters will be employed to designate "high" voltages or open-circuit conditions at a particular point in the circuit, and the primed capital letters will designate "low" voltage conditions, or ground potential at the same point. Thus, the designation "X" indicates a "high" voltage at the input to circuit 44, and a grounded condition at the input to circuit 44 is designated by the symbol "X′."

Considering the operation of the circuit 46, the output at the collector of transistor 70 included in this circuit is high when either of the two inputs to circuit 46 is grounded. The input to circuit 46 from circuit 44 is grounded when the input to circuit 44 is high. This corresponds to the condition designated X. The output from circuit 46 is also high if the input to circuit 46 from circuit 40 is grounded. This corresponds to the "reset" state of the multivibrator and is designated A′, in contradistinction to the designation A for the "set" state of the multivibrator. In Boolean algebraic terms, an OR function is designated by a plus sign. Accordingly, the collector of transistor 70 is high under the Boolean algebraic conditions indicated by the expression $A'+X$.

Considering the mode of operation of circuit 48 in Fig. 2, its output will be high or open-circuited when either of its two input leads are grounded. When input X is high, the lead connecting circuit component 44 to circuit 48 is at ground potential. Now, considering the input circuit to circuit 48 from circuit 46, it is at ground potential when both inputs to circuit 46 are high. This occurs when the input to circuit 44 is low or ground, and when the multivibrator is in the "set" state. Required simultaneous conditions are expressed in Boolean algebraic terms as a product. The conditions required to make the output from circuit 46 low are indicated by the Boolean algebraic expression $A \cdot X'$. Accordingly, the Boolean algebraic expression for the conditions at which the output of circuit 48 is high is $X + A \cdot X'$. This means that the output signal is high when input X is high, or when input X is low and when the multivibrator 40, 42 is in the "set" state required to produce a high signal at output A.

In addition to output lead 72 from circuit 48, there are two additional output leads 74 and 76 shown at the upper right of Fig. 2. Output lead 74 is connected directly to the output of circuit 40 of the multivibrator and therefore is high whenever the multivibrator is in the "set" state. This is indicated by the letter A associated with this output lead. The output lead 76 is connected from the output of circuit 46. It is in the high or open-circuited state under the conditions indicated by the Boolean algebraic expression $A' + X$.

In the circuit of Fig. 2 each of the circuits connecting the logic "building blocks" 40, 42, and 44 with the next successive logic block 46 or 48 includes a diode. It is occasionally desirable to insert an inversion stage in the logic circuitry of the type disclosed in the present application. Such an inversion circuit merely changes high input signals to low output signals, and vice versa. If two stages are connected output to input, and the first stage is not connected to an input of any other stage, no diode is required in the connecting path between the two stages. Referring to Fig. 2, the circuit 46 is an inversion stage, and the diodes at the output of circuit 46 are only necessary to avoid coupling of signals from circuit 44 to output lead 76. In the absence of additional circuits coupled to lead 76, the collector of transistor 70 may be connected directly to the input of circuit 48.

At this point, it is considered desirable to emphasize the direct connections between the transistors in the circuits in accordance with the invention. When these direct connections are employed, a driving transistor can draw reverse base current directly from a controlled transistor in a subsequent stage. The term "conductive circuit" is therefore employed to distinguish the present interconnections from the less efficient circuits of the prior art, in which the coupling circuits include condensers, transformers, or oppositely poled high back voltage diodes.

A few simple logic functions are performed by the circuit of Fig. 2. However, in the light of the principles of Boolean algebra, it is clear that any combinational switching function may be realized by the proper arrangement of the logic "building blocks" discussed above. As indicated in the text cited above and in an article entitled "An Application of Boolean Algebra to the Design of Electronic Switching Circuits" by S. H. Washburn, A.I.E.E. Transactions, part I, Communications and Electronics, volume 72, September 1953, any combinational switching circuit may be formed from AND circuits, OR circuits, and negation circuits. The article cited above also shows that an OR circuit with negation or inversion circuits in series with its input and output leads is the full equivalent of an AND circuit. Accordingly, an AND circuit and an inversion circuit constitute a "fundamental set" of logical operators in the sense that any combinational switching function may be built up from these elemental circuits; similarly, an OR circuit and an inversion circuit is also such a "fundamental set." We have noted above that the circuit of Fig. 1 is an inversion circuit when it has a single input and output, and that it may perform either OR or AND functions, in accordance with the signal convention which is employed. It is clear, therefore, that a circuit for performing any desired combinational switching function may be implemented with the logic building blocks disclosed in the drawings and described above.

It is to be understood that the above-described arrangements are illustrative of the application of the principles of the invention. Numerous other arrangements may be devised by those skilled in the art without departing from the spirit and scope of the invention.

What is claimed is:

1. In a transistor-diode logic circuit, a driven transistor having base, emitter and collector electrodes, said emitter electrode being grounded, a resistive circuit element having one terminal connected to the base of said transistor, at least one input circuit comprising a diode and an associated transistor having a grounded emitter electrode and a collector electrode, said diode of each input circuit being connected between its associated transistor collector electrode and the other terminal of said resistive circuit element, said diode of each input circuit having its low resistance direction poled in opposition to the low resistance direction of the base-to-emitter junction of said driven transistor, first means including a source of voltage connected to the diode side of said resistive element for normally biasing the base-to-emitter junction of said driven transistor in the low resistance state, and second means including another source of voltage coupled to the driven transistor side of said resistive element for biasing the base-to emitter junction of said driven transistor toward the high resistance direction.

2. In combination, first and second transistors each having base and emitter input electrodes and a collector output electrode, means for applying control signals to the input electrodes of said first transistor, a resistive element having one terminal connected to the base of said second transistor, a diode connected between the collector of said first transistor and the other terminal of said resistive element, and means for respectively applying biasing voltages of opposite polarities to the two terminals of said resistive element.

3. In combination in a transistor-diode logic circuit, first and second transistors each having base and emitter input electrodes and a collector output electrode, and an asymmetrically conducting device having two electrodes, a resistive element interconnecting one electrode of said device and the base of said second transistor, the other electrode of said device being connected to the collector of said first transistor, the low resistance direction of the base-to-emitter junction of said second transistor being poled in opposition to that of said device, first means including a source of voltage of one polarity connected to the device side of said resistive element for biasing the base-to-emitter junction of said transistor in one direction, second means including a second source of voltage of the opposite polarity connected to the transistor side of said resistive element for biasing the base-to-emitter junction of said second transistor in the opposite direction, said first means normally overcoming said second means so that said second transistor is normally energized, and control means for energizing said first transistor and thereby disabling said first means so that said second transistor is de-energized.

4. A logical circuit arrangement comprising a driven transistor having base, emitter and collector electrodes, said emitter electrode being connected to ground, an output circuit connected to said collector electrode, input diode means including first and second terminals, driving means connected between one terminal of said input diode means and ground, and means intercoupling the other terminal of said input diode means and the base electrode of said driven transistor, said intercoupling means including means responsive to an ungrounded condition of said driving means for biasing the base-to-emitter junction of said driven transistor in the forward direction and responsive to a steady state grounded condition of said driving means for maintaining the base-to-emitter junction of said driven transistor in a reverse-bias condition so that current flows in said output circuit in response to the ungrounded condition of said driving means and does not flow in said output circuit in response to the grounded condition of said driving means.

5. In combination, a driven transistor including base and grounded emitter input electrodes and a collector electrode, a utilization circuit connected to said collector electrode, a two-terminal asymmetrically conducting device, switching means connected between ground and one terminal of said device, and voltage level shifting means connected between the other terminal of said device and the base of said driven transistor, the low resistance direction of said device being poled in opposition to the low resistance direction of the base-to-emitter junction of said transistor, said voltage level-shifting means including means for biasing said transistor so that said utilization circuit is energized in response to the steady state ungrounding of the one terminal of said device and for biasing said transistor so that said utilization circuit is de-energized in response to the steady state grounding of the one terminal of said device.

References Cited in the file of this patent

UNITED STATES PATENTS

| | | |
|---|---|---|
| 2,745,956 | Baker | May 15, 1956 |
| 2,786,964 | De Witt et al. | Mar. 26, 1957 |
| 2,853,632 | Gray | Sept. 23, 1958 |

FOREIGN PATENTS

| | | |
|---|---|---|
| 763,735 | Great Britain | Dec. 19, 1956 |

OTHER REFERENCES (Pub. I) Richards: Arithmetic Operations in Digital Computers, D. Van Nostrand Company, Inc., Princeton, New Jersey, 1955, pages 78, 79.

Notice of Adverse Decision in Interference

In Interference No. 91,714 involving Patent No. 2,964,653, W. B. Cagle and W. H. Chen, Diode-transistor switching circuits, final judgment adverse to the patentees was rendered Aug. 7, 1962, as to claim 5.

[*Official Gazette October 16, 1962.*]